(12) United States Patent
Frisch et al.

(10) Patent No.: US 8,582,331 B2
(45) Date of Patent: Nov. 12, 2013

(54) INVERTER TOPOLOGIES USABLE WITH REACTIVE POWER

(75) Inventors: Michael Frisch, Unterhaching (DE); Ernö Ternesi, Bakony (HU)

(73) Assignee: Vincotech Holdings S.à.r.l., Luxembourg (LU)

( * ) Notice: Subject to any disclaimer, the term of this patent is extended or adjusted under 35 U.S.C. 154(b) by 728 days.

(21) Appl. No.: 12/505,852

(22) Filed: Jul. 20, 2009

(65) Prior Publication Data

US 2011/0013438 A1 Jan. 20, 2011

(51) Int. Cl.
*H02H 7/122* (2006.01)

(52) U.S. Cl.
USPC .................. 363/56.02; 363/40; 363/131

(58) Field of Classification Search
USPC .................. 363/123, 131, 132, 140
See application file for complete search history.

(56) References Cited

U.S. PATENT DOCUMENTS

| | | | | |
|---|---|---|---|---|
| 4,926,302 A | * | 5/1990 | Harada et al. | 363/16 |
| 5,107,151 A | * | 4/1992 | Cambier | 327/432 |
| 5,202,820 A | * | 4/1993 | Miller et al. | 363/56.02 |
| 6,906,481 B1 | * | 6/2005 | Atmur | 318/400.27 |
| 6,927,987 B2 | * | 8/2005 | Farrington et al. | 363/56.02 |
| 6,930,899 B2 | * | 8/2005 | Bakran et al. | 363/132 |
| 7,126,409 B2 | * | 10/2006 | Nielsen | 327/391 |
| 7,518,334 B2 | * | 4/2009 | Hochhausen et al. | 318/809 |
| 7,619,910 B2 | * | 11/2009 | Hesterman et al. | 363/132 |
| 7,630,221 B2 | * | 12/2009 | Sui et al. | 363/70 |
| 7,639,515 B2 | * | 12/2009 | Ponnaluri et al. | 363/17 |
| 7,706,163 B2 | * | 4/2010 | Tan et al. | 363/132 |
| 7,782,032 B2 | * | 8/2010 | Taufik et al. | 323/272 |
| 8,094,475 B2 | * | 1/2012 | Friebe et al. | 363/132 |
| 8,111,530 B2 | * | 2/2012 | Ono et al. | 363/56.01 |

(Continued)

OTHER PUBLICATIONS

Jiang, Yimin et al. "Soft-Switching of IGBT's With the Help of MOSFET's in Bridge-Type Converters", 1993, Virginia Power Electronics Center, The Bradley Department of Electrical Engineering, Virginia Polytechnic Institute and State University, pp. 151-157.*

(Continued)

*Primary Examiner* — Adolf Berhane
*Assistant Examiner* — Lakaisha Jackson
(74) *Attorney, Agent, or Firm* — Michael Best & Friedrich LLP (57) ABSTRACT

The present invention generally relates to power electronic switching circuits and in particular to inverter modules employing two or more controlled switches that can be used with reactive loads. An inverter circuit is provided which includes first and second input terminals for being connected to a DC power source; first and second output terminals for outputting an AC voltage; at least one metal oxide semiconductor field effect transistor, MOSFET, having a parasitic body diode. The inverter circuit further includes at least one disabling element for disabling said body diode. This may result in an improved efficiency of the inverter circuit in combination with a reactive power capability. Further, a semiconductor switching device is disclosed, comprising at least one metal oxide semiconductor field effect transistor, MOSFET, and at least one insulated gate bipolar transistor, IGBT, wherein said MOSFET and said IGBT are connected in parallel.

9 Claims, 8 Drawing Sheets

(56) References Cited

U.S. PATENT DOCUMENTS

| | | | |
|---|---|---|---|
| 8,111,531 B2* | 2/2012 | Ilic | 363/132 |
| 2003/0151935 A1* | 8/2003 | Lubomirsky | 363/125 |
| 2006/0044856 A1* | 3/2006 | Bird et al. | 363/131 |
| 2007/0109824 A1* | 5/2007 | Romenesko | 363/41 |
| 2008/0130326 A1* | 6/2008 | Kuan | 363/21.14 |
| 2008/0224812 A1* | 9/2008 | Chandrasekaran | 336/212 |
| 2009/0316458 A1* | 12/2009 | Gonzalez Senosiain et al. | 363/132 |
| 2010/0149846 A1* | 6/2010 | Tan et al. | 363/132 |

OTHER PUBLICATIONS

Jiang, Yimin et al., "Soft-Switching of IGBT's With the Help of MOSFET's in Brigde-Type Converters", 1993, Virginia Power Electronics Center, pp. 151-157.*

Frisch, Michael, "High efficient topologies for next generation solar inverter," Jul. 2008, pp. 1-6.Vincotech GmbH.

Frisch, Michael, "Innovative topologies for high efficient solar applications," Nov. 2008, pp. 1-2. Vincotech GmbH.

Frisch, Michael, "High efficient topologies for next generation solar inverter," Bodo's Power, Aug. 2008, pp. 20-24.

* cited by examiner

INVERTER TOPOLOGIES USABLE WITH REACTIVE POWER

BACKGROUND OF THE INVENTION

The present invention generally relates to power electronic switching circuits and in particular to inverter modules employing two or more controlled switches.

Efficiency is becoming increasingly important in the field of power electronics and in many applications, such as inverter modules for the solar market, the efficiency optimization turned out to represent a major design goal. Photovoltaic solar panels com-monly use PWM, pulse width modulation, inverters to convert DC power generated by the solar cell into AC power which can be fed into the power grid. Typical further appli-cations of these inverters include their use in uninterruptable power supplies, UPS, fuel cells and wind turbines. Further, PWM inverters may be used to provide compensation for reactive loads, harmonic cancellation of supply grids, or as variable speed drives for induction motors. The most commonly used inverters are one phase and three phase transformerless inverters.

The most common switching elements used in inverter designs are field effect transis-tors, FET, such as metal oxide semiconductor field effect transistors, MOSFET, bipolar transistors, such as insulated gate bipolar transistors, IGBT, bipolar junction transis-tors, BJT, and gate turn-off thyristor, GTO. Traditionally, MOSFETs have been used for low DC voltage or low power inverter designs. IGBTs have been used in medium to high power or high voltage inverter designs. GTOs have been used in very high power inverter designs.

In order to obtain low losses in an inverter, it is desirable to use transistors that have low switching losses and to use antiparallel/free-wheeling diodes across each transis-tor with good recovery behavior. MOSFETs are generally known to have very good switching performance but the internal antiparallel body diode exhibits poor recovery behavior. This diode can conduct current even if another current path is available, such as a parallel connected free-wheeling diode. When a MOSFET switch turns off, the current can transfer from the MOSFET channel into the parasitic body diode. When the control MOSFET turns on, the recovery charge stored in the body diode during conduction is swept out. Abrupt reverse recovery of the body diode can cause higher switching losses and high frequency ringing, which places higher stresses on the com-ponents and can couple to the output and can cause noise and electromagnetic inter-ference, EMI, associated problems. To compensate, inverter designs using MOSFETs have traditionally required the addition of both series and free-wheeling ultra fast di-odes. The addition of these diodes significantly increases the cost of the inverter de-sign and adds conduction losses. For these reasons IGBTs have been a more practi-cal choice for inverters operating above 100 to 200 VDC. IGBTs typically have poorer switching performance than MOSFETs, but require the addition of fewer diodes to pro-vide rapid recovery behavior, since the internal series diode present in IGBTs allows the designer to add a single diode to the free-wheeling path. The use of IGBTs can reduce the cost of an inverter design but may lower the inverter efficiency at higher frequencies.

Figure 12:
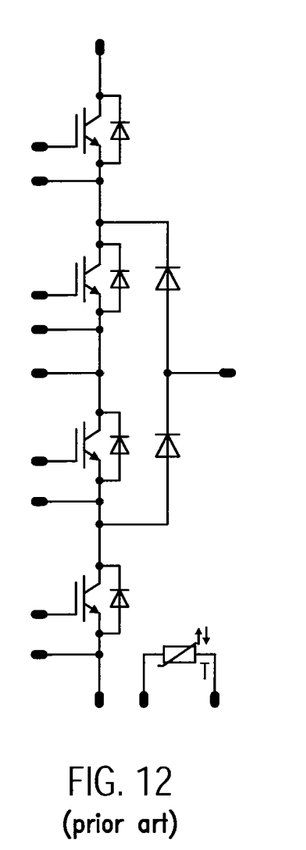
FIG. 12 shows a bridge configuration using only IGBTs according to the state of the art.

Furthermore, when developing highly efficient inverter topologies which can handle reactive power, the intrinsic diode of the MOSFET will cause high reverse recovery losses when reactive power has to be managed. FIG. 12 shows an inverter circuit be-ing formed only by IGBTs which, however, is not fast enough for most novel solar ap-plications.

Figure 13:
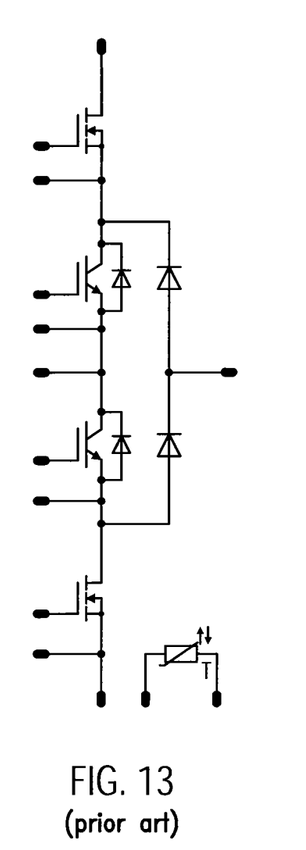
FIG. 13 shows a bridge configuration inverter using a combination of MOSFETs and IGBTs according to the state of the art.

In FIG. 13 a combined IGBT and MOSFET inverter architecture is shown. This com-bined circuit, however, has the disadvantage that in the case of reactive power the intrinsic body diode causes losses which deteriorate the efficiency to an unacceptable extent.

Consequently, for future solar inverters a further improvement of efficiency and the ability to handle reactive power is needed.

In particular, the arrangement shown in FIG. 13 can only be used when dealing with a reactive load, if a fast recovery epitaxial diode field effect transistor, a so-called FRED-FET, is used. However, these components usually have a higher Rds-on and therefore the losses are significant. Another disadvantage is that their poor reverse recovery properties lead to an unsatisfactory performance in power factor compensation and bi-directional usage.

Accordingly, there is a need to provide an inverter power module that effectively con-trols and minimizes the effect of the body diode of MOSFETs and specifically, there is a need to provide means to reduce the adverse effects of EMI and the power loss due to the parasitic body diode.

SUMMARY OF THE INVENTION

The present invention relates to inverter circuits that can be used with reactive loads. An inverter circuit is provided which comprises first and second input terminals for be-ing connected to a DC power source; first and second output terminals for outputting an AC voltage; at least one metal oxide semiconductor field effect transistor, MOSFET, having a parasitic body diode. The inverter circuit further comprises at least one dis-abling element for disabling said body diode. This results in high efficiency of the in-verter circuit in combination with a reactive power capability.

The present invention may be used for highly efficient solar inverters, uninterruptable power sources, UPS, bidirectional chargers, for instance for use with electrical vehicles and highly efficient and high-speed motor drives for use in electrical vehicles.

This disabling element which can be used in bridge or in neutral point clamped, NPC, configurations, can comprise a bypass diode for providing an alternative conduction path for a reactive load current or an inductor for decoupling the MOSFET from the reactive load.

Together with the bypass electrode additional protection components can be used. As protection element either a suppressor diode connected with a high voltage FRED can be used which protects which the IGBT from reverse current when the parasitic capac-ity of the MOSFET is charged at switch-off. Instead of such a suppressor diode a ca-pacitor paralleled with a resistor can also be used as protection component.

When decoupling the MOSFET by means of an inductor, also a bypass diode for the reverse path can be advantageous.

The present invention also relates to a semiconductor switching device, comprising at least one metal oxide semiconductor field effect transistor, MOSFET, having a drain terminal and a source terminal, and at least one insulated gate bipolar transistor, IGBT, having a collector terminal and an emitter terminal, wherein said MOSFET and said IGBT are connected in parallel by coupling the collector terminal of the IGBT to the drain terminal of the MOSFET, and by coupling the emitter terminal of the IGBT to the source terminal of the MOSFET. This structure results in two basic improvements in efficiency:

Firstly, the efficiency at high load range is enhanced by allocating the static losses of the switch to the IGBT and the dynamic losses to the MOSFET. Secondly, the effi-ciency at light load range can be enhanced by assigning both the static and the switch-ing losses to the MOSFET. The MOSFET turns on fast and is delayed at switch-off so that the switching losses are assigned to the MOSFET. The MOSFET will also carry the current at low power, thus eliminating one pn junction voltage drop of the IGBT, whereas the IGBT will take the majority at maximum load condition. At low load the IGBT is not conducting at all, so resistential tail current losses are eliminated for the whole power range. Therefore it is possible to improve both the overall and the maximum load efficiency.

The idea of connecting the IGBT and the MOSFET in parallel can be applied to all IGTB based topologies where the switching losses are significantly high, and in all MOSFET topologies which have significant static losses. For solar applications, NPC topologies play a significant role.

The invention minimizes the effect of parasitic body diodes by preventing significant current flow through the internal body diode of MOSFETs present in an inverter circuit. This ensures minimal body diode reverse recovery effects on every switching cycle. The switching circuit is made more robust because of the reduced power loss, which in turn allows for the use of smaller components, smaller filters, less heat sinking and potentially lower total costs.

The above brief summary has been provided so that the nature of the invention may be understood quickly. A more complete understanding of the invention may be ob-tained by reference to the following detailed description, advantageous embodiments in connection with the attached drawings.

BRIEF DESCRIPTION OF THE DRAWINGS

The foregoing features and other features of the present invention will now be de-scribed with reference to the draw-ings. In the drawings, the same components have the same reference numerals. The accompanying drawings are incorporated into and form a part of the specification for the purpose of explaining the principles of the invention. The drawings are not to be construed as limiting the invention to only the illustrated and described examples of how the invention can be made and used. Further features and advantages will become apparent from the following and more particular description of the invention which is illustrated in the accompanying drawings, wherein:

FIG. 9 is a diagram of the inverter efficiency of the arrangement of FIG. 9 in compari-son to the arrangement of FIG. 2;

DETAILED DESCRIPTION

Figure 1:
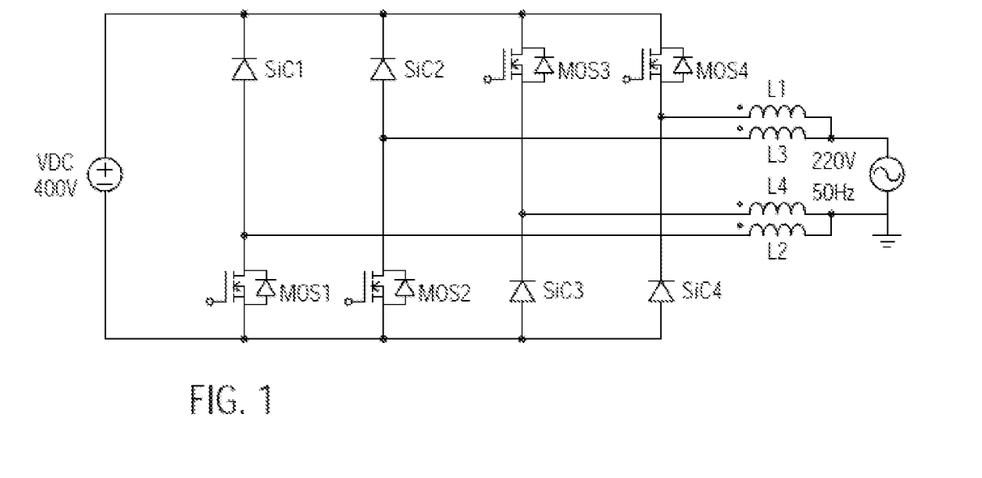
FIG. 1 shows a bridge configuration inverter only using MOSFETs and being suitable also for reactive loads.

FIG. 1 shows a highly efficient inverter topology having the ability to handle a reactive load which uses only MOSFET switches in a full bridge configuration. The circuit shown in FIG. 1 is coupled to a 400 Volt DC input as it results for instance from a solar photovoltaic panel. The output can be connected to the 220 Volt AC 50 Hz power grid and tolerates reactive power, even if it is not only necessary for line impedance meas-urements or for the protection of the components at special conditions. The circuit al-lows for full reactive power and enlarges the use as a cos $\phi$ compensation of the power grid and also for fully bidirectional applications, such as high-efficiency battery chargers. An excellent efficiency level is reached in both directions when using silicon carbide Schottky diodes.

Figure 2:
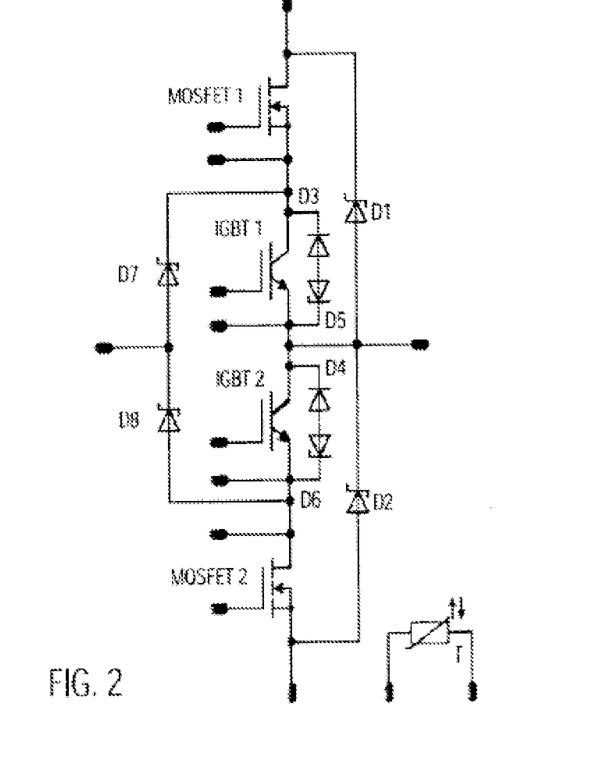
FIG. 2 shows an NPC inverter with mixed chip configuration comprising bypass di-odes for reactive power.
Figure 14:
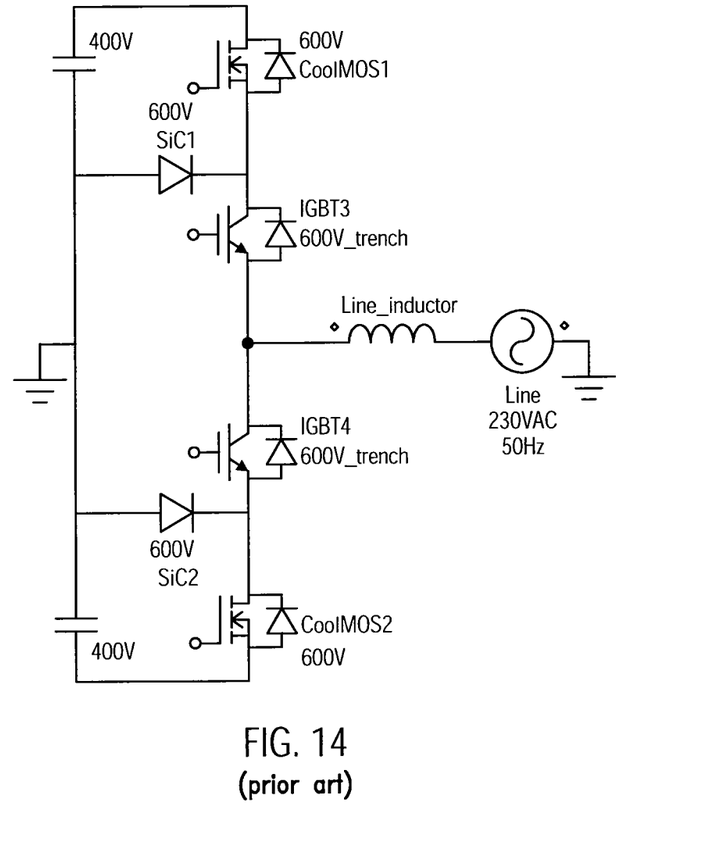
FIG. 14 shows a NPC inverter using a combination of MOSFETs and IGBTs according to the state of the art.

When referring to FIG. 14, a neutral point clamped, NPC, inverter is shown which uses a mixed chip configuration, i.e. MOSFETs in combination with IGBTs. The NPC in-verter of FIG. 14 reaches 99.2% European efficiency, EE, at 2 kW nominal power. However, it cannot be used with reactive power. As shown in FIG. 2, by adding two bypass diodes D1, D2 in the output, reactive power can be handled. These bypass diodes D1 and D2 are for instance made from silicon carbide and have a breakdown voltage of 1200 V.

As a protective circuit, a suppressor diode D3, D4 con-nected in series with a high-voltage FRED D5, D6 protects the IGBT from reverse current when the parasitic ca-pacity of the MOSFETs is charged at switch-off. It is also possible to design a bidirec-tional inverter with highest efficiency for the reverse conversion. For this purpose, sili-con carbide Schot-tky technology is recommended for 1200 V rectifier.

Figure 3:
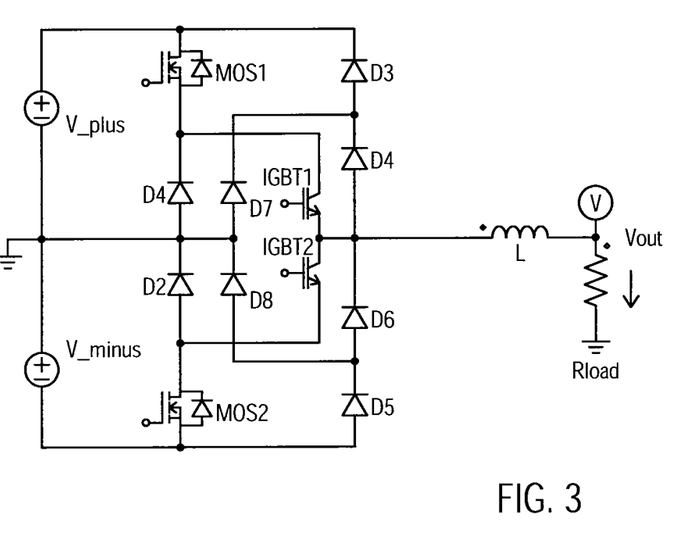
FIG. 3 shows an NPC inverter with split-up bypass diode paths.

As these high-voltage silicon carbide diodes are expensive, the circuit of FIG. 3 repre-sents an improved topology for high efficiency compensation or bidirectional mode and only needs silicon carbide rectifiers with 600 V breakdown voltage. In this circuit of course the IGBT1 and IGBT2 can also be provided with a protective diode as shown in FIG. 2. Diodes D1, D2, D4 and D6 are formed by 600 V SiC Schottky diodes, whereas D3 and D5 are fast silicon diodes and D7 and D8 are small silicon diodes to protect the rectifier from overvoltage.

If the arrangements of FIGS. 2 and 3 is to be modified in a way that the design is only using MOSFETs, it is necessary to disable all the body diodes of the MOSFETs. This can be achieved according to the present invention by using separate outputs and in-dividual decoupling inductors L1, L2 for each of the output paths.

Figure 4:
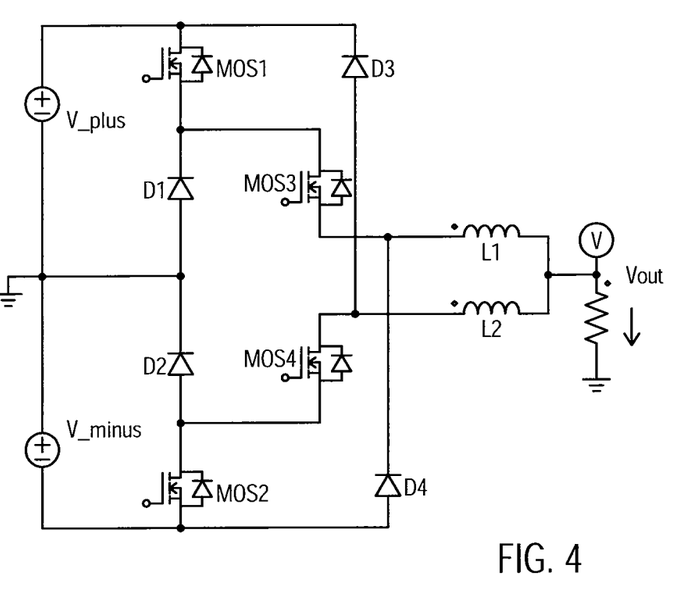
FIG. 4 shows an NPC inverter with decoupled output and MOSFETs for all switches.

An NPC inverter with separated output and MOSFETs for all switches is shown in FIG. 4. This figure corresponds to the mixed chip solution of FIG. 2 using 1200 V SiC di-odes for the reactive power option. In contrast to the mixed chip solution of FIG. 2, the circuit of FIG. 4 using only MOSFETs can significantly augment the inverter efficiency.

Figure 5:
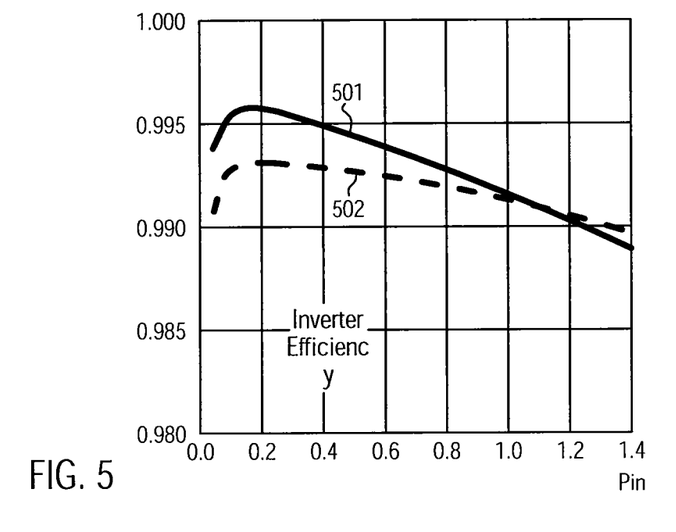
FIG. 5 is a diagram of the inverter efficiency comparing the inverter topologies of FIGS. 3 and 4.

This is illustrated in FIG. 5. Here the inverter efficiency is shown in correlation with the input power. The circuit of FIG. 4 is represented by a solid line 501 and the mixed solu-tion of FIG. 3 is represented by the broken line 502. The nominal power in this case was PN=2 kW. As can be derived from this figure, the circuit of FIG. 4 mainly im-proves the efficiency at low power. The efficiency of the inverter module is increased from 99.2 percent to 99.4 percent. The reactive power is managed by fast 1200 V diodes D3, D4. Silicon carbide diodes are recommended for maximum efficiency in the reverse direction.

Figure 6:
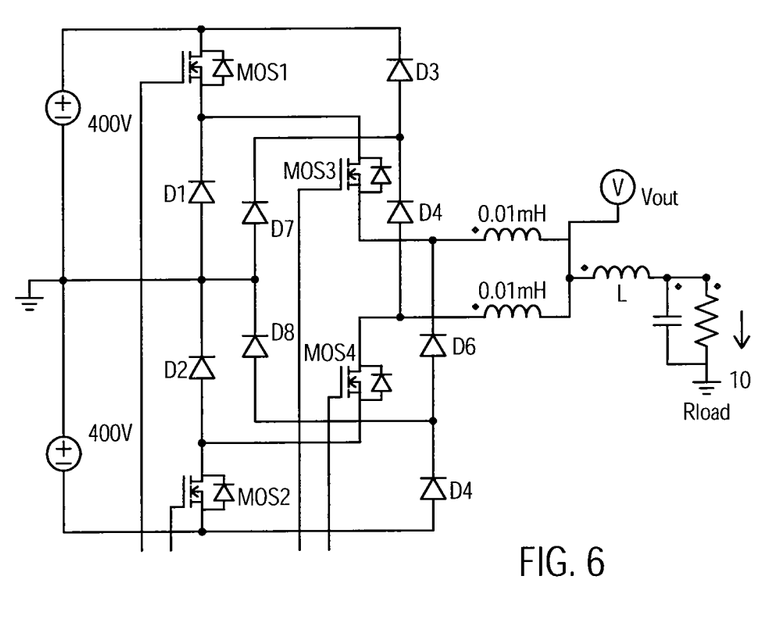
FIG. 6 shows an NPC inverter with decoupling inductors at the output and bypass diodes analog to FIG. 3.

In an analogous way as shown in FIG. 3, also the bypass diode paths D3, D4 of FIG. 4 can be split up in order to allow the use of diodes having lower breakdown voltages. This is shown in FIG. 6. Here diodes D1, D2, D4 and D6 are formed by 600 V SiC Schottky diodes, whereas the remaining diodes are fast 600 V silicon diodes. The sili-con carbide diodes represent the rectifying diodes, whereas the silicon diodes account for the reactive power option.

According to a further aspect of the present invention, the efficiency at the high load range and at the light load range can be improved by using a MOSFET paralleled with an IGBT as the switching devices in any of the inverter structures.

Figure 7:
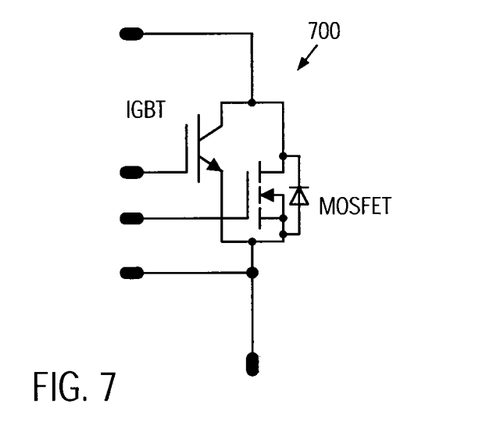
FIG. 7 shows a semiconductor switching device comprising a MOSFET in parallel with an IGBT.

FIG. 7 shows the diagram of such a semiconductor switching device 700. The IGBT and the MOSFET are connected to each other in parallel by coupling the collector ter-minal of the IGBT to the drain terminal of the MOSFET, and by coupling the emitter terminal of the IGBT to the source ter-minal of the MOSFET.

This combination allows two basic improvements regard-ing the efficiency: first, the efficiency at high load range can be enhanced by assigning the static losses of the switch to the IGBT and the dynamic losses to the MOSFET. Secondly, the efficiency at light load can be enhanced by assigning both the static and the switching losses to the MOSFET.

The MOSFET turns on fast and is delayed at switch-off so that the switching losses are assigned to the MOSFET. The MOSFET will also carry the current at low power, so elimi-nating one pn junction voltage drop of the IGBT. The IGBT, on the other hand, will take the majority at maximum load condition. At low load the IGBT is not conduct-ing at all, so the resistential tail current losses are eliminated for the whole power range. With the structure of FIG. 7 it is therefore possible to improve both the overall and maximum load effi-ciency. At switch-on, the gate of the MOSFET is directly parallel with the IGBT gate, because the MOSFET will be faster and take over the switch-on losses. However, at switch-off the MOSFET has to be controlled in order to be delayed so that the IGBT can be released from switch-off losses. Semi-conductor switching de-vices according to FIG. 7 can be used in all IGBT based topologies where the switch-ing losses are significantly high and in every MOSFET topology having significant static losses. In particular, for solar applications including the reactive power feature, topologies which are shown in the following will be of interest.

Figure 8:
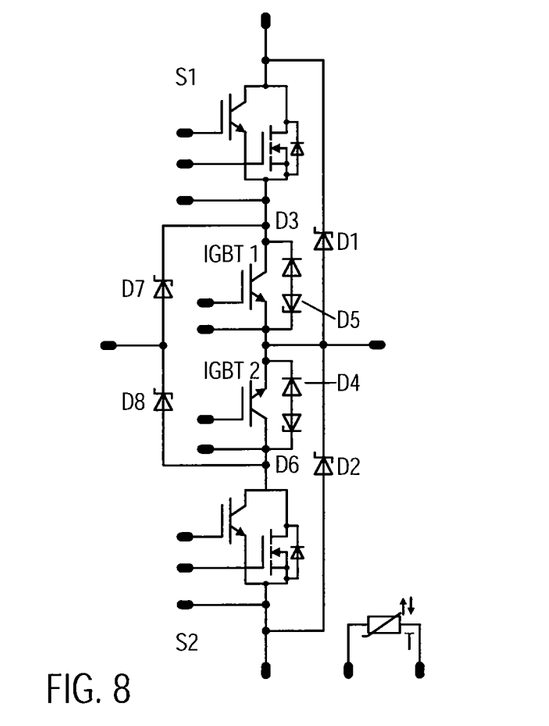
FIG. 8 shows the configuration of FIG. 2 using the switching devices of FIG. 7 instead of the pure MOSFETs.

When referring back to FIG. 2, the inventive semiconduc-tor switching device according to FIG. 7 can replace MOS-FET 1 and MOSFET 2, respectively. This modified NPC inverter circuit is shown in FIG. 8. An advantageous applica-tion for such an inverter are applications with power ratings of more than 7 kW and DC voltages higher than 600 V. The inverter circuit of FIG. 8 can for instance be implemented as an integrated power module. When using 1200 V diodes D1 and D2, the active current will be trans-ported because the intrinsic characteristics of the diodes of the MOSFETs which are part of the switches S1 and S2, are disabled. The suppres-sor diode connected with a high voltage FRED protects the IGBTs from reverse current when the parasitic capac-ity of the MOSFETs is charged at switch-off.

Figure 9:
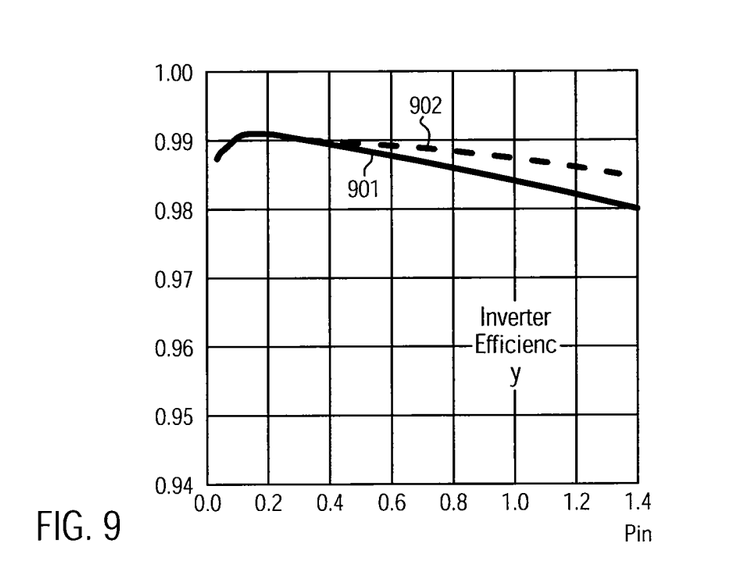

FIG. 9 shows a comparison between the efficiency of the inverter structure of FIG. 2 (solid line 901) and the efficiency of the circuit according to FIG. 8 (broken line 902). As can be seen from FIG. 9, in particular for higher power the efficiency is augmented significantly. For FIG. 9 an implementation of FIG. 2 with a 45 mΩ CoolMOS MOSFET was compared to the arrangement of FIG. 8 using a 99 mΩ CoolMOS in par-allel with PTIGBT. The frequency was 16 kHz and the nomi-nal power PN is 1 kW (CoolMOS is a trademark of INFIN-EON).

Figure 10:
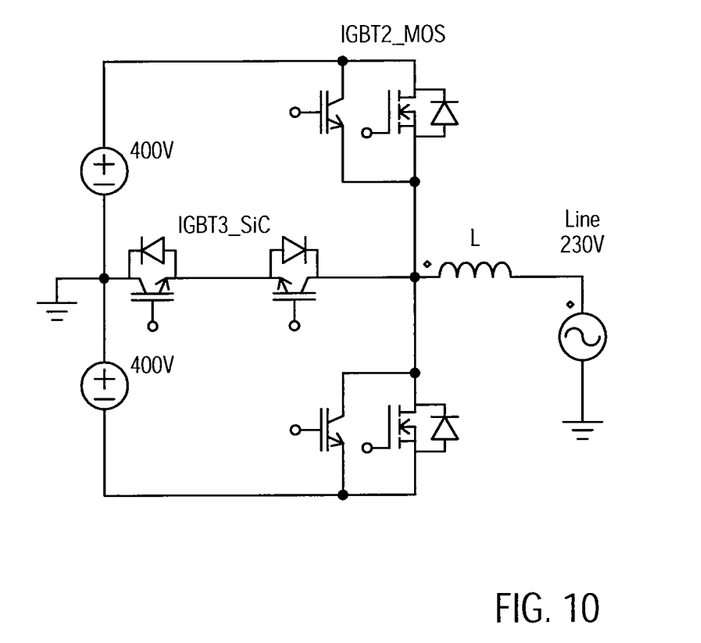
FIG. 10 shows a high voltage NPC circuit using the parallel structure of FIG. 7.
Figure 11:
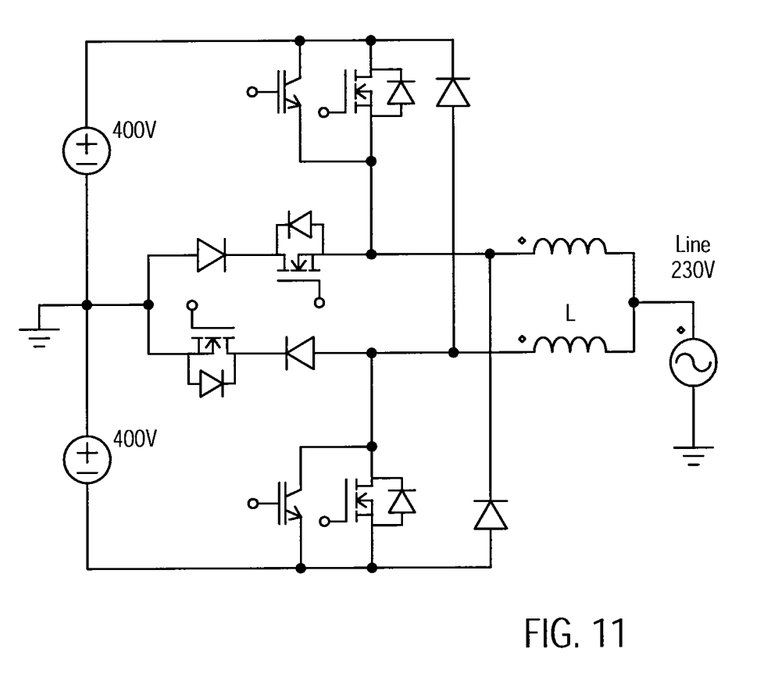
FIG. 11 shows a high voltage NPC inverter circuit with decoupling inductors and by-pass diodes.

FIG. 10 depicts a three level inverter circuit which is able to gain further efficiency by using higher voltage switches. This high voltage NPC can achieve circuit efficiencies of more than 99% at higher power levels. Because of the neutral clamping, it is possible to use the MOSFETs up to nearly the breakdown voltage. The handling of reactive power is limited with the circuit of FIG. 10 because of the limitation of the body diode of the MOSFET. In order to further improve the circuit of FIG. 10, therefore, a circuit where the IGBTs which are connected in series between the neutral point and the out-put are connected in an antiparallel fashion, is shown in FIG. 11. In FIG. 11 a MOSFET followed by a diode is shown. However, the switch in the neutral point clamp can of course also be an IGBT or a semiconductor switch according to FIG. 7 containing both.

In order to achieve a high efficiency in combination with reactive power capability, the present invention proposes inverter circuits which are based on the common idea to disable the body diode of the MOSFET in bridge or neutral point clamped configura-tions. This disabling can be imple-mented by a bypass diode and some protection components as this is shown in FIGS. 2 and 8. As protection elements a suppressor diode connected with a high voltage FRED can be provided which protects the IGBT from reverse current, when the parasitic capacity of the MOSFET is charged at switch-off. The suppressor diode can also be replaced by a capacitor which is paralleled with a resistor.

Alternatively, the decoupling by means of inductors in connection with a bypass diode for the reverse path, is used in the embodiments shown in FIGS. 1, 3, 4, 6 and 11.

While the invention has been described with respect to the physical embodiments con-structed in accordance therewith, it will be apparent to those skilled in the art that vari-ous modifications, variations and improvements of the present invention may be made in the light of the above teachings and within the purview of the appended claims with-out departing from the spirit and intended scope of the invention.

In addition, those areas in which it is believed that those ordinary skilled in the art are familiar have not been described herein in order not to unnecessarily obscure the in-vention described herein.

Accordingly, it is to be understood that the invention is not to be limited by the specific illustrated embodiments but only by the scope of the appended claims.

What is claimed is:

1. Neutral point clamped, (NPC), inverter circuit compris-ing:
 a first input terminal for being connected to a DC voltage of a first polarity, and a second input terminal for being connected to a DC voltage of a polarity opposite to said first polarity;
 an input neutral point terminal for being connected to a ground potential;
 a first output connected to a first end of a first decoupling inductor;
 a second output connected to a first end of a second decou-pling inductor;
 an output connection point for outputting an AC voltage being connected to a second end of the first decoupling inductor and to a second end of the second decoupling inductor;

a first metal oxide semiconductor field effect transistor (MOSFET), a second MOSFET, a third MOSFET, and a fourth MOSFET, wherein
 each of the first, second, third, and fourth MOSFET has a parasitic body diode,
 a drain of the first MOSFET is connected to the first input terminal and a source of the first MOSFET is connected to a drain of the second MOSFET,
 a source of the second MOSFET is connected to the first output,
 a drain of the third MOSFET is connected to the second output, and
 a source of the fourth MOSFET is connected to the second input terminal and a drain of the fourth MOSFET is connected to a source of the third MOSFET;
a first diode and a second diode, wherein
 a cathode of the first diode is connected to the drain of the second MOSFET,
 a cathode of the second diode and an anode of the first diode are connected to the input neutral point terminal, and
 an anode of the second diode is connected to the source of the third MOSFET;
a third diode and a fourth diode, wherein
a cathode of the third diode is connected to the first input terminal and an anode of the third diode is connected to the second output; and
an anode of the fourth diode is connected to the second input terminal and a cathode of the fourth diode is connected to the first output.

2. Neutral point clamped, (NPC), inverter circuit comprising:
 a first input terminal for being connected to a DC voltage of a first polarity, and a second input terminal for being connected to a DC voltage of a polarity opposite to said first polarity;
 an input neutral point terminal for being connected to a ground potential;
 an output connection point for outputting an AC voltage;
 a first metal oxide semiconductor field effect transistor (MOSFET), a first insulated gate bipolar transistor (IGBT), a second MOSFET and a second IGBT, wherein
  each of the first and second MOSFETs has a parasitic body diode,
  a drain of the first MOSFET is connected to the first input terminal and a source of the first MOSFET is connected to a collector of the first IGBT,
  an emitter of the first IGBT is connected to a collector of the second IGBT,
  the emitter of the first IGBT and the collector of the second IGBT are connected to the output connection point,
  an emitter of the second IGBT is connected to a drain of the second MOSFET, and
  a source of the second MOSFET is connected to the second input terminal;
a first diode and a second diode, wherein
 a cathode of the first diode is connected to the collector of the first IGBT,
 a cathode of the second diode and an anode of the first diode are connected to the input neutral point terminal, and
 an anode of the second diode is connected to the emitter of the second IGBT;
a third diode and a fourth diode, wherein
 a cathode of the third diode is connected to the first input terminal and an anode of the third diode is connected to the output connection point, and
 an anode of the fourth diode is connected to the second input terminal and a cathode of the fourth diode is connected to the output connection point;
a first protective circuit for protecting the first IGBT from reverse current when the parasitic capacitance of the MOSFETs is charged at switch-off; and
a second protective circuit for protecting the second IGBT from reverse current when the parasitic capacitance of the MOSFETs is charged at switch-off,
wherein each of the first and second protective circuits includes a fifth diode in series with a sixth diode.

3. NPC inverter circuit of claim 2, wherein the sixth diode is a Zener diode, a cathode of the Zener diode is connected to the emitter of the respective IGBT, an anode of the Zener diode is connected to an anode of the fifth diode, and a cathode of the fifth diode is connected to the collector of the respective IGBT.

4. NPC inverter circuit of claim 2, wherein the sixth diode is a fast recovery epitaxial diode (FRED), an anode of the FRED is connected to the emitter of the respective IGBT, a cathode of the FRED is connected to an anode of the fifth diode, and a cathode of the fifth diode is connected to the collector of the respective IGBT.

5. NPC inverter circuit of claim 2, further comprising a third IGBT and a fourth IGBT, wherein a collector of the third IGBT is connected to the drain of the first MOSFET, an emitter of the third IGBT is connected to the source of the first MOSFET, a collector of the fourth IGBT is connected to the drain of the second MOSFET, and an emitter of the fourth IGBT is connected to the source of the second MOSFET.

6. Neutral point clamped, (NPC), inverter circuit comprising:
 a first input terminal for being connected to a DC voltage of a first polarity, and a second input terminal for being connected to a DC voltage of a polarity opposite to said first polarity;
 an input neutral point terminal for being connected to a ground potential;
 a first output connected to a first end of a first decoupling inductor;
 a second output connected to a first end of a second decoupling inductor;
 an output connection point for outputting an AC voltage being connected to a second end of the first decoupling inductor and to a second end of the second decoupling inductor;
 a first metal oxide semiconductor field effect transistor (MOSFET) and a second MOSFET, wherein
  each of the first and second MOSFET has a parasitic body diode,
  a drain of the first MOSFET is connected to the first input terminal and a source of the first MOSFET is connected to the first output,
  a source of the second MOSFET is connected to the second input terminal and a drain of the second MOSFET is connected to the second output,
a first diode and a second diode, wherein
 a cathode of the first diode is connected to the first input terminal and an anode of the first diode is connected to the second output; and
 an anode of the second diode is connected to the second input terminal and a cathode of the second diode is connected to the first output;

a third diode connected in series with a third transistor, wherein
- an anode of the third diode is connected to the input neutral point terminal, a cathode of the third diode is connected to a first end of the third transistor, and a second end of the third transistor is connected to the first output; and a fourth diode connected in series with a fourth transistor, wherein
- an anode of the fourth diode is connected to the second output, the cathode of the fourth diode is connected to a first end of the fourth transistor, and a second end of the fourth transistor is connected to the input neutral point terminal.

7. NPC inverter circuit of claim 6, further comprising a first IGBT and a second IGBT, wherein a collector of the first IGBT is connected to a drain of the first MOSFET, an emitter of the first IGBT is connected to a source of the first MOSFET, a collector of the second IGBT is connected to a drain of the second MOSFET, and an emitter of the second IGBT is connected to a source of the second MOSFET.

8. NPC inverter circuit of claim 6, wherein the third transistor and the fourth transistor are MOSFETs, the first end of the third transistor relates to the drain of the MOSFET corresponding to the third transistor, the second end of the third transistor relates to the source of the MOSFET corresponding to the third transistor, the first end of the fourth transistor relates to the drain of the MOSFET corresponding to the fourth transistor, and the second end of the fourth transistor relates to the source of the MOSFET corresponding to the fourth transistor.

9. NPC inverter circuit of claim 6, wherein the third transistor and the fourth transistor are IGBTs.

* * * * *

UNITED STATES PATENT AND TRADEMARK OFFICE
CERTIFICATE OF CORRECTION

PATENT NO.        : 8,582,331 B2                                      Page 1 of 1
APPLICATION NO.   : 12/505852
DATED             : November 12, 2013
INVENTOR(S)       : Michael Frisch et al.

It is certified that error appears in the above-identified patent and that said Letters Patent is hereby corrected as shown below:

On the title page, under the subheading "Inventors:"
replace the second joint inventor's last name [[Ternesi]] with -- Temesi --

Signed and Sealed this
Eleventh Day of March, 2014

Michelle K. Lee
*Deputy Director of the United States Patent and Trademark Office*